(12) United States Patent
Leu et al.

(10) Patent No.: US 7,572,676 B2
(45) Date of Patent: Aug. 11, 2009

(54) PACKAGING STRUCTURE AND METHOD OF AN IMAGE SENSOR MODULE

(75) Inventors: Fang-Jun Leu, Hsinchu (TW); Shou-Lung Chen, Yangmei Township, Taoyuan County (TW); Ching-Wen Hsiao, Banciao (TW); Shan-Pu Yu, Chiayi (TW); Jyh-Rong Lin, Tucheng (TW); I-Hsuan Peng, Jhudong Township, Hsinchu County (TW); Jian-Shu Wu, Peikang Township, Yunlin County (TW); Hui-Mei Wu, Jhudong Township, Hsinchu County (TW); Chien-Wei Chieh, Wujie Township, Yilan County (TW)

(73) Assignee: Industrial Technology Research Institute (TW)

( * ) Notice: Subject to any disclaimer, the term of this patent is extended or adjusted under 35 U.S.C. 154(b) by 287 days.

(21) Appl. No.: 11/790,313

(22) Filed: Apr. 25, 2007

(65) Prior Publication Data

US 2007/0195188 A1 Aug. 23, 2007

Related U.S. Application Data

(62) Division of application No. 11/194,669, filed on Aug. 2, 2005, now Pat. No. 7,411,306.

(30) Foreign Application Priority Data

Aug. 3, 2004 (TW) ............................. 93123218 A (51) Int. Cl.
  *H01L 21/00* (2006.01)
(52) U.S. Cl. ............................. 438/116; 257/E21.505
(58) Field of Classification Search ................. 438/116, 438/609; 257/E21.505
  See application file for complete search history.

(56) References Cited

U.S. PATENT DOCUMENTS 7,488,612 B2 * 2/2009 Yang et al. ..................... 438/30

* cited by examiner

*Primary Examiner*—W. David Coleman
(74) *Attorney, Agent, or Firm*—Bacon & Thomas, PLLC (57) ABSTRACT

This invention relates to a packaging structure and method of an image sensor module. The method comprises: providing a transparent substrate having a first patterned conductive layer; carrying an image sensor integrated circuit chip having a photosensitive active area and at least one passive chip on the transparent substrate, wherein the photosensitive active area faces the transparent substrate; forming an insulating build-up film over the transparent substrate; and forming a plurality of conductive vias in the insulating build-up film wherein the ends of the conductive vias are connected with the passive chip or the first patterned conductive layer of the transparent substrate while the other ends of the conductive vias are exposed on the surface of the insulating build-up film. The packaging method is capable of down-sizing the construction of the image sensor module and simplifying the processing steps.

12 Claims, 7 Drawing Sheets

PACKAGING STRUCTURE AND METHOD OF AN IMAGE SENSOR MODULE

BACKGROUND OF THE INVENTION

This application is a Division of nonprovisional application Ser. No. 11/194,669, filed Aug. 2, 2005, now U.S. Pat. No. 7,411,306.

FIELD OF INVENTION

The present invention relates to a flip chip packaging structure and method of a semiconductor integrated circuit and, in particular, to a flip chip packaging structure and method of an image sensor.

DESCRIPTION OF THE RELATED ART

Multilayer packaging is one of the most advanced processes for fabricating semiconductor integrated circuit (IC) products. With the multilayer package, the space between the electrodes of an IC chip having multilayer package electric circuits is increased; the chip is protected from the internal stresses of the package and any external stresses, and an appropriate thermal path for dissipating heat generated by the chip and an electrical interconnection are established. The method for packaging an IC chip is deemed as the system used for the package, dominating the total cost, performance and reliability of the whole package chip.

IC chip packaging generally falls into two categories, that is, hermetic packages and non-hermetic packages. When a chip is packaged by the hermetic package, it is isolated from the external environment by a vacuum seal or a particular kind of gas surrounding the chip. In general, such hermetic packages are the ceramic packaging used for high efficient applications. In other words, when a chip is packaged by the non-hermetic packages, it is not substantially isolated from the external environment. In this light, the hermetic packages have higher fabrication cost than the non-hermetic packages. Even so, the hermetic packages are still needed in some particular applications such as image sensors or pressure detectors. The recently advanced application with the plastic packaging has expanded the scope of usage and the performance of the hermetic packages. Since the traditional method for fabricating products is good for automatic batch processing, the plastic packages are highly cost-effective.

An IC chip packaging recently developed is ball grid array (BGA) packages, which can be used for both the ceramic packaging and the plastic packages. The BGA packages use a plurality of solder balls or bumps to serve as interconnections between the IC chip and other micro electronic devices providing electricity, mechanical support or heat transfer. The solder balls or bumps cause the IC chip to be fixedly mounted on a circuit board, and are electrically connected with the conductive pattern of the circuit board. The BGA techniques are included in the bonding technology defined as the controlled collapse chip connection (C4) or the flip chip technology.

The flip chip technique can be used to bond various circuit boards comprising a ceramic substrate, a printed circuit board, a flexible circuit and a silicon substrate. The solder bumps are generally disposed on a conductive bond pad of an area array of a flip chip, the conductive bond pad being electrically interconnected to an electric circuit trace on the flip chip. Since micro-electric circuits of the flip chip will generally perform various functions, a number of solder bumps will therefore be required. As a rule, each side of the flip chip has a size of about 13 mm, resulting in solder bumps jammed on the perimeter of the flip chip. Thus, the conductive pattern of the flip chip is consisted of various conductors spaced apart appropriately equal to or less than 0.1 mm as a matter of course.

Leadless chip carrier (LCC) packages are generally found in an image sensor such as a charge coupled device (CCD) image sensor or a complementary metal oxide semiconductor (CMOS) image sensor.

The CCD image sensor is an electronic device capable of converting an optical pattern or image into a charged pattern or an electronic image, comprising a number of photosensitive units capable of modifying, storing and transferring a charge to another photosensitive unit. In designing an image sensor, the material is selected subject to the photosensitivity of silicon. Each photosensitive unit represents a pixel. Semiconductor technologies and design rules dominate the array structure and matrix structure of the pixels. Signal output from the CCD is modified by means of one or more than one amplifier disposed on the edge of the chip. An electronic image is obtained by a series of pulses which sequentially output the charge of one pixel in array after another pulse is output to an output amplifier. Then, the output amplifier converts the charge into a voltage. An external electric circuit transfers an output signal in an appropriate form for detection or pick-up.

The CMOS image sensors operate at a voltage lower than the CCD image sensor so as to reduce power consumption and facilitate the portability. Each CMOS active pixel sensing unit has an amplifier with buffering capability for reading/writing separately. A conventional pixel sensing unit has four transistors and a photosensitive unit. The pixel sensing unit has a transfer gate for separating the photosensitive unit from a floating diffusion having a capacitance, a reset gate interposed between the floating diffusion and a power supply, a source-follower transistor for temporarily storing the capacitance of a read-out line in the floating diffusion, and a row of select gates for connecting the pixel sensing unit to the read-out line. All the pixels connected in column are connected to a shared sense amplifier.

In comparison with the CCD image sensor, the CMOS image sensor not only reduces power consumption but also has a generally simple scheme due to decoupling and crystallization characteristics. Hence, a miniature CMOS image sensor is easy to design, requiring fewer circuits in support thereof.

Figure 5:
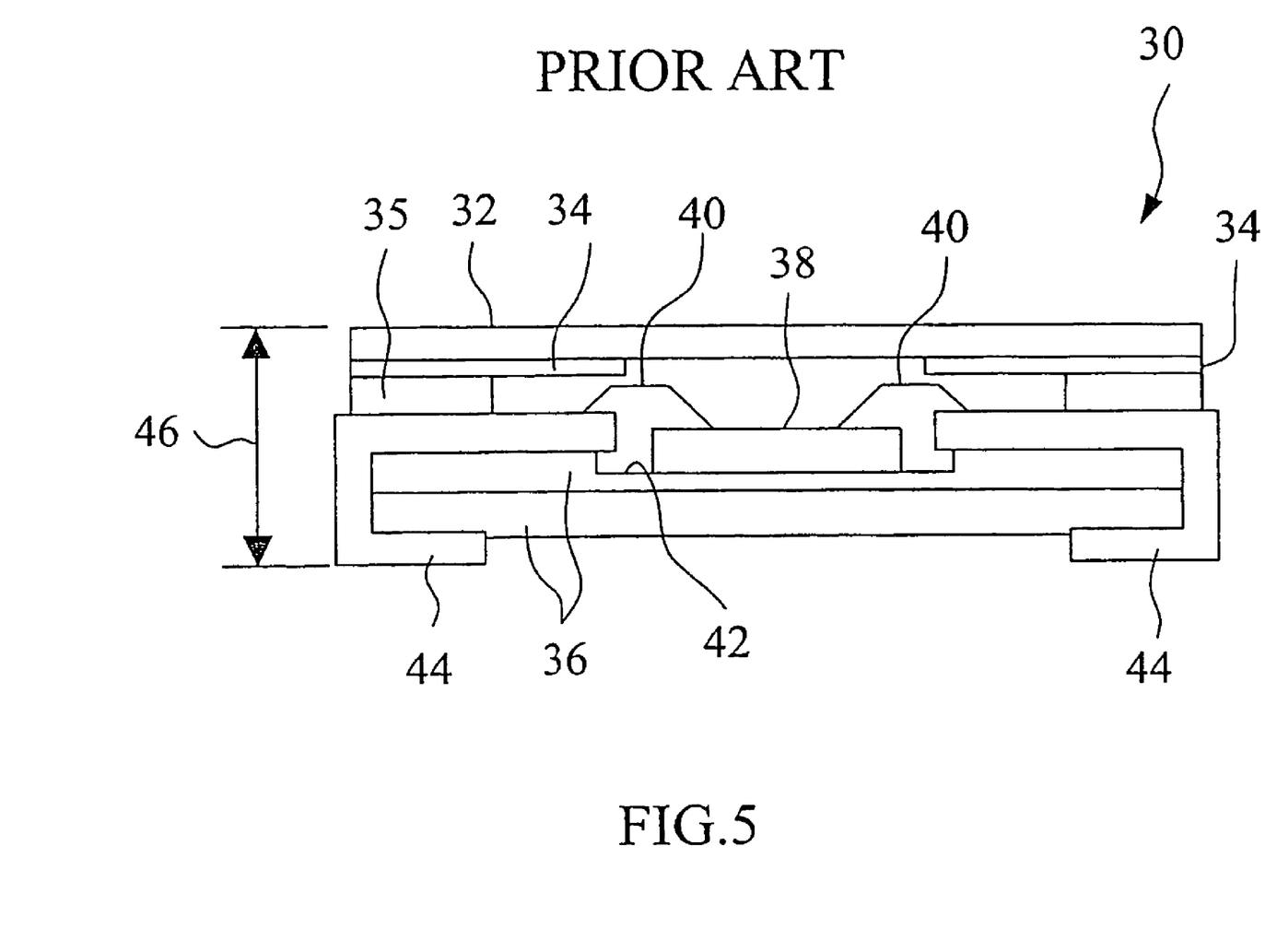
FIG. 5 is a cross-sectional view of a conventional LCC package used for an image sensor module

FIG. 5 shows a traditional leadless chip carrier package 30 which is generally used for a CCD or CMOS image sensor IC chip. The leadless chip carrier package 30 comprises a transparent cap layer 32 made of glass having a supporting layer 35. An anti-reflection coating 34 is interposed between the glass cap 32 and the supporting layer 35. A multilayer substrate 36 has a castle-shaped structure 42 with an image sensor chip 38 provided thereon. An upper lead 40 extends from the chip 38 to be electrically connected to a lower lead 44 encased on the bottom and the sides of the substrate 36. The transparent glass cap 32 facilitates light transmission to the image sensor chip 38.

The leadless chip carrier package 30 generally has a thickness 46 of about 2 mm. When the leadless chip carrier package 30 is used for the image sensor package 30, a relatively large space is required. In most cases, an over-sized image sensor restricts the utilization of the leadless chip carrier package 30. In this light, there is a dire need to provide the image sensors with a new and improved packaging structure and method.

BRIEF SUMMARY OF THE INVENTION

A primary object of the present invention is to provide a packaging structure of an image sensor module so as to have a compact size, integrally assemble a passive chip processing the signals of an image sensor into the packaging structure, and simplify the process for fabricating the image sensor module.

Another object of the present invention is to provide a BGA packaging structure of an image sensor module so as to be capable of batch-manufacture and improve the production efficiency of the mass production.

A further object of the present invention is to provide a packaging method of an image sensor module that is suitable for packaging a CCD image sensor or a CMOS image sensor.

A further object of the present invention is to provide a BGA packaging method for an image sensor module so as to significantly reduce the thickness of the package.

To attain the aforesaid objects, a packaging method of an image sensor module according to the present invention comprises: providing a transparent substrate having a first patterned conductive layer; carrying an image sensor integrated circuit chip having a photosensitive active area and at least one passive chip having at least one bond pad on the transparent substrate, wherein the photosensitive active area faces the transparent substrate and the bond pad of the passive chip is disposed in a direction opposing the transparent substrate; forming an insulating build-up film over the transparent substrate; and forming a plurality of conductive vias on the insulating build-up film wherein the ends of the conductive vias are connected with the bond pad of the passive chip or the first patterned conductive layer of the transparent substrate, while the other ends of the conductive vias are exposed on the surface of the insulating build-up film.

To attain the aforesaid objects, a packaging structure of an image sensor module according to the present invention comprises: a transparent substrate having a first patterned conductive layer; an image sensor integrated circuit chip having a photosensitive active area carried on the transparent substrate and being electrically connected to the first patterned conductive layer of the transparent substrate, wherein the photosensitive active area faces the transparent substrate; at least one passive chip having at least one bond pad bonded to the transport substrate with the bond pad opposing the transparent substrate; and at least one insulating build-up film over the transparent substrate, having a plurality of conductive vias and a first surface opposing the transparent substrate, wherein the ends of the conductive vias are connected with the bond pad or the first patterned conductive layer, the other ends of the conductive vias are exposed on the first surface.

The packaging structure of the image sensor package of the present invention is efficient in space utilization, as compared with the traditional image sensor package structure, for example, an LCC package. The thickness of the packaging structure of the image sensor package of the present invention is about 1 mm while the thickness of the LCC package is about 2 mm. Accordingly, the construction of the image sensor device with the packaging structure of the present invention is down-sized compared with the traditional packaging structure of the CCD image sensor or the CMOS image sensor.

As a rule, an image sensor module includes a number of passive chips controlling and processing the signals of the integrated circuit chips of the image sensor. Therefore, to simplify the processing steps of the fabrication of the image sensor module, the integrated circuit chips of the image sensor and the passive chips are buried in a single image sensor module, and the signals are connected to the outside by the build-up method which is commonly applied in the passive chip package. The build-up method is a non-mechanical drilling in association with pressing either a resin coated copper foil (RCC) or a copper foil having an adhesive tap on the surface of the substrate, wherein the copper foil interconnects the conductive lines by photo via or laser via.

Additional features and advantages of the present invention will be set forth in part in the description which follows, and in part will be obvious from the description, or may be learned by practice of the present invention. The features and advantages of the present invention will be realized and attained by means of the elements and combinations particularly pointed out in the henceforth appended claims.

It is to be understood that both the foregoing general description and the following detailed description are exemplary and explanatory only and are not restrictive of the present invention, as claimed.

The accompanying drawings, which are incorporated in and constitute a part of this specification, illustrate several embodiments of the present invention and together with the description, serve to explain the principles of the present invention.

DESCRIPTION OF THE EMBODIMENTS

Reference will now be made in detail to present embodiments of the present invention, examples of which are illustrated in the accompanying drawings. Wherever possible, the same reference numbers will be used throughout the drawings to refer to the same or like parts.

Figure 1A:
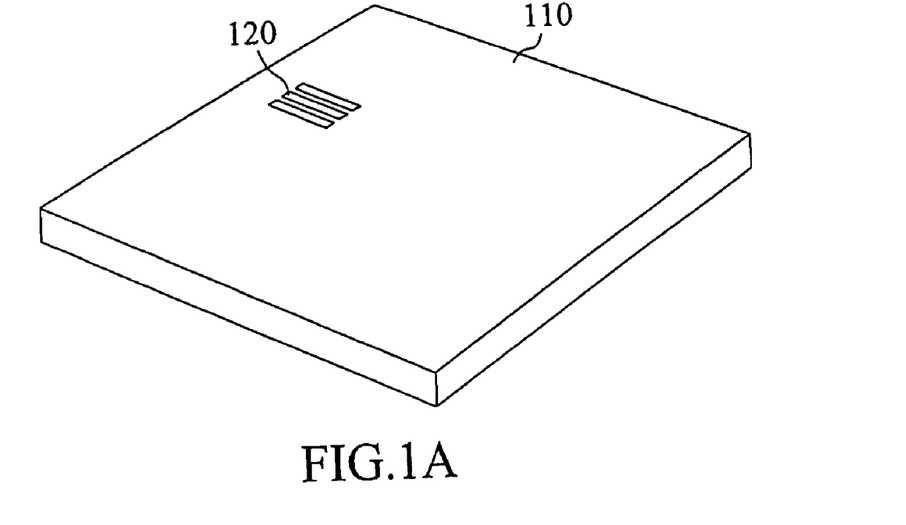
FIGS. 1A through 1F are flowcharts illustrating the steps of a packaging method of an image sensor module according to the present invention.
Figure 1B:
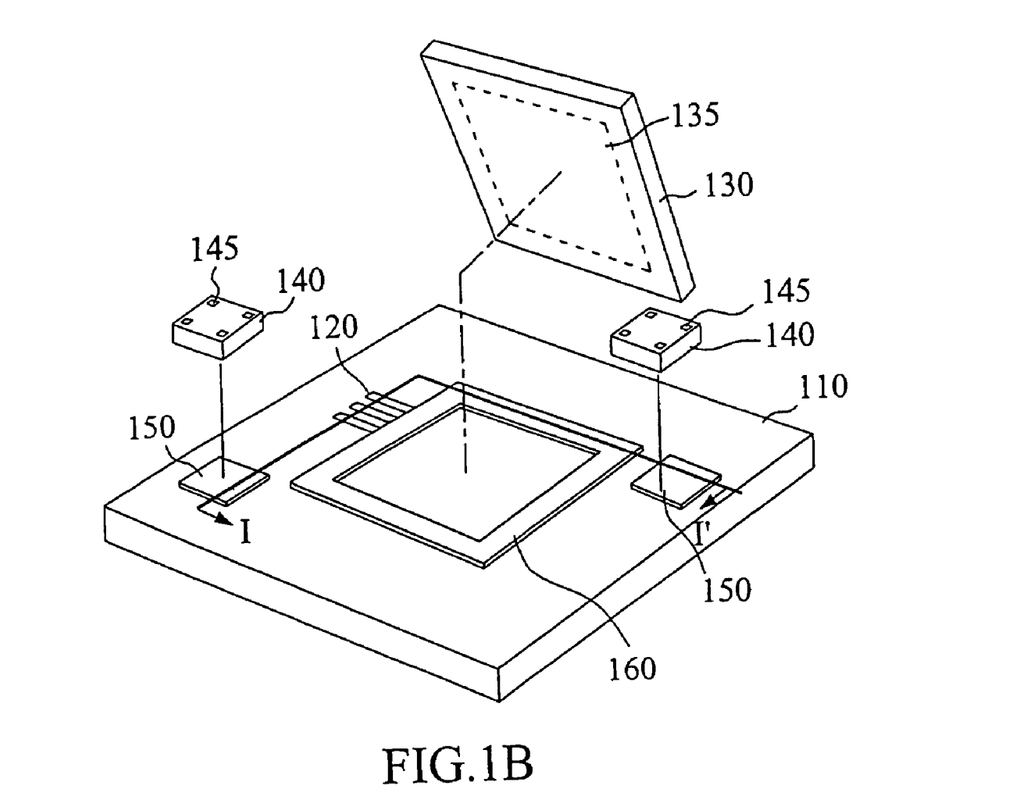
Figure 1C:
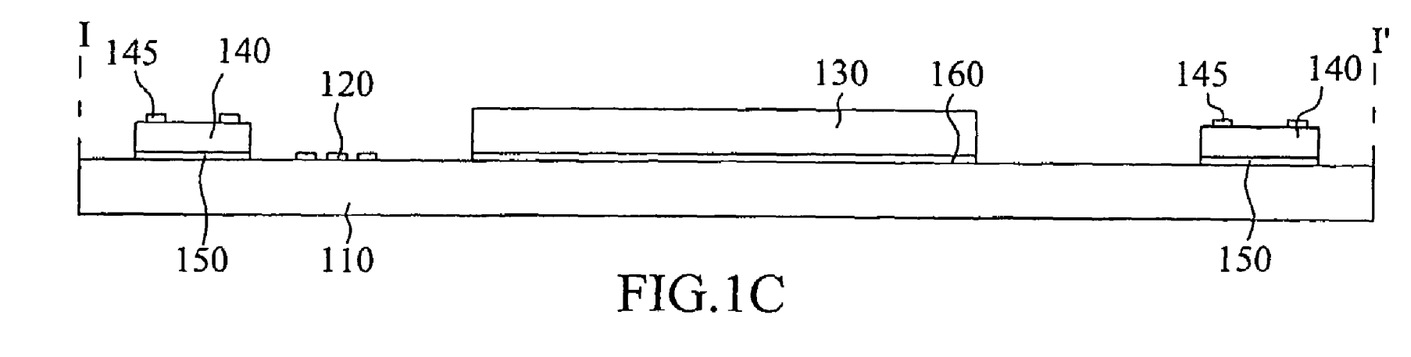
Figure 1D:
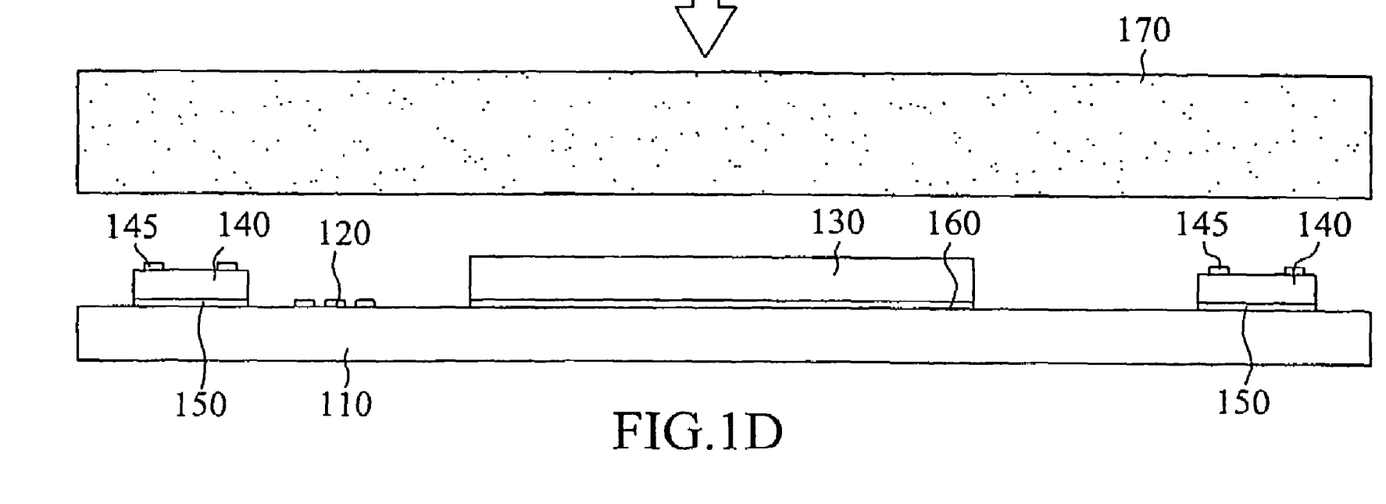
Figure 1E:
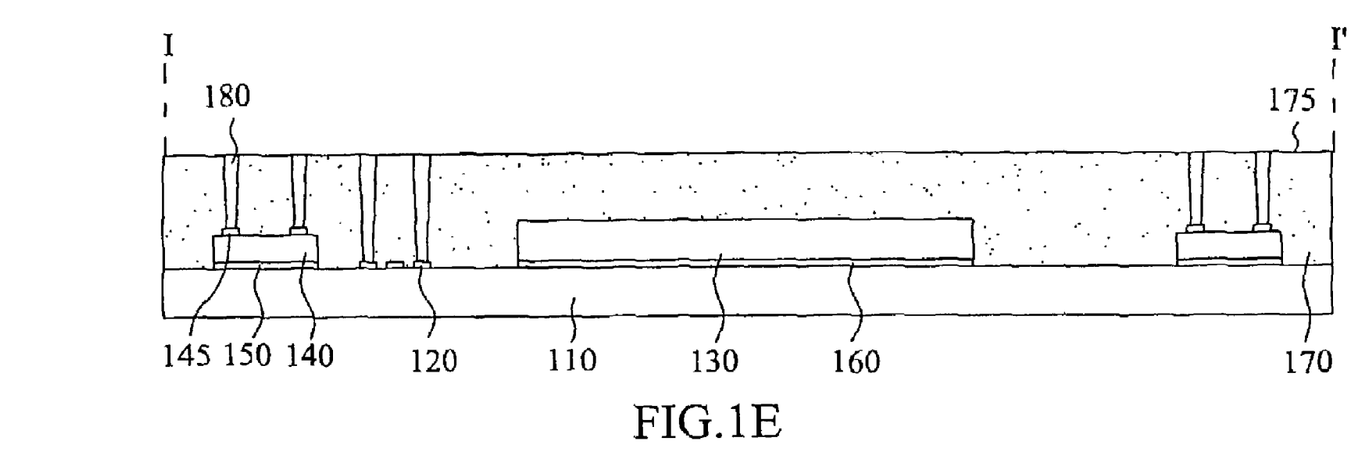

A thorough process for packaging an image sensor module of the present invention is shown in FIG. 1A through FIG. 1F. Referring to FIG. 1A, a first patterned conductive layer 120 is formed on a transparent substrate 110. The method for forming the first patterned conductive layer 120 is not specifically defined, but is generally by sputtering, evaporation, screen-printing or film-bonding. Next, referring to FIG. 1B, an adhesive 150 is coated over the transparent substrate 110 to carry at least one passive chip 140 having at least one bond pad 145, and an anisotropic conductive adhesive (ACA) 160 or a non-conductive adhesive (NCA) is coated to carry an image sensor integrated circuit chip 130 having a photosensitive active area 135. As such, the photosensitive active area 135 faces the transparent substrate 110 while the bond pad 145 of the passive chip is disposed in a direction opposing the transparent substrate 110. The method for carrying the image sensor integrated circuit chip 130 further comprises a solder bump. Alternatively, the anisotropic conductive adhesive 160 or the nonconductive adhesive can be replaced with another means, for example, a solder ball for soldering. In addition, the transparent substrate 110 may further comprise an active chip (not shown) having at least one bond pad carried on the transparent substrate 110, wherein the bond pad of the active chip opposes the transparent substrate 110. The passive chip 140 can also be fabricated as a build-in printing passive device in the subsequent build-up process. The passive chip 140 and the image sensor integrated circuit chip 130 are then bonded to the transparent substrate 110, as shown in FIG. 1C which is a cross-sectional view taken alone the line I-I' of FIG. 1B. Then, referring to FIG. 1D, an insulating build-up film 170 is pressed onto the transparent substrate 110. The method for forming the insulating build-up film 170 over the transparent substrate 110 is not particularly limited to the pressing and it can be achieved by another method such as spin coating. Furthermore, the thickness of the insulating build-up film 170 formed on the transparent substrate 110 is not specifically defined. Preferably, the thickness of the insulating build-up film 170 is less than that of the image sensor integrated circuit chip 130 so that a surface of the image sensor integrated circuit chip 130 opposing the photosensitive active area 135 is exposed in order to increase the capability of heat dissipation of the image sensor integrated circuit chip 130. In addition, the insulating build-up film 170 is made of a material which has excellent electrical isolation and is capable of being processed by laser. In general, a resin coated copper foil (RCC) or a copper foil having an adhesive tap is used to this end. Referring FIG. 1E, a plurality of conductive vias 180 is formed on the insulating build-up film 170 in which the bottom ends of the conductive vias 180 are connected with the bond pad 145 of the passive chip 140 or the first patterned conductive layer 120 of the transparent substrate 110 while the top ends of the conductive vias 180 are exposed on an upper surface 175 of the insulating build-up film 170. The method for forming the conductive vias 180 is not specifically defined, but preferably is by laser drilling or photolithography. Then, a conductive material is formed in the conductive vias 180 by electroplating so that the signals of the image sensor integrated circuit chip 130 can be transmitted by means of the first patterned conductive layer 120 and the conductive vias 180 while the signals of the passive chip 140 are input or output by means of the conductive vias 180.

Figure 1F:
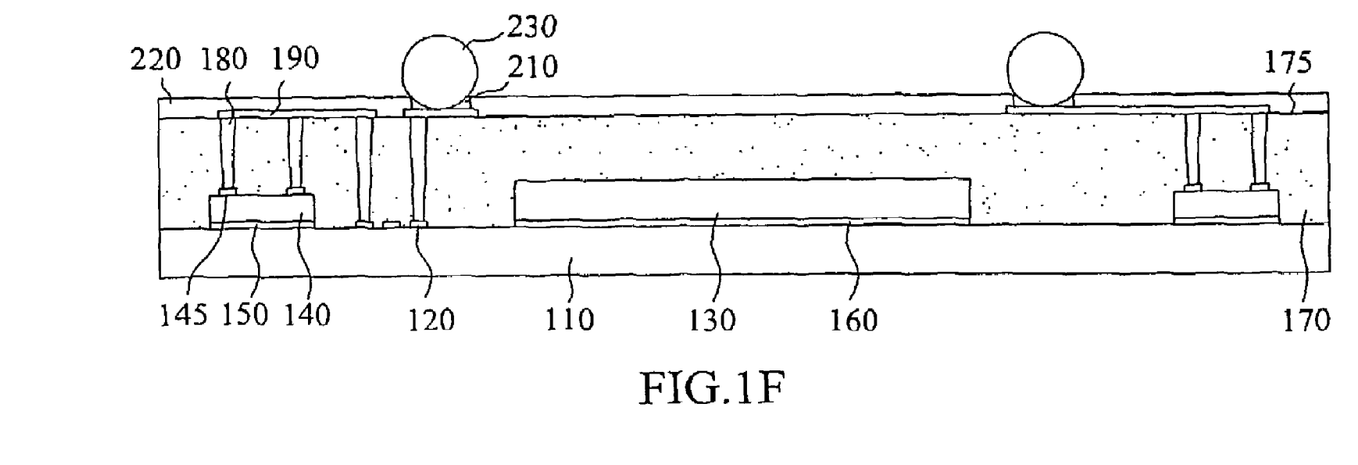

As shown in FIG. 1F, the packaging method of an image sensor module preferably further comprises the step of forming a second patterned conductive layer 190 over the upper surface 175 of the insulating build-up film 170. After the second patterned conductive layer 190 is formed, a solder mask layer 220 having a plurality of via-holes 210 is formed over the second patterned conductive layer 190 to protect the second patterned conductive layer 190 and prevent moisture from getting into the chip. Finally, a plurality of solder balls 230 is formed in the via-holes 210 of the solder mask layer 220 to complete the image sensor module package. Even so, the film build-up method can be applied repeatedly after the formation of the second patterned conductive layer 190. That is, an insulting build-up film, a plurality of conductive vias in the insulating build-up film and a third patterned conductive layer over the insulating build-up film are formed in so order.

Three preferred embodiments of the present invention are described hereinafter for illustrating the technical merits of the present invention.

EMBODIMENT 1

Packaging Structure of an Image Sensor Module

Figure 2:
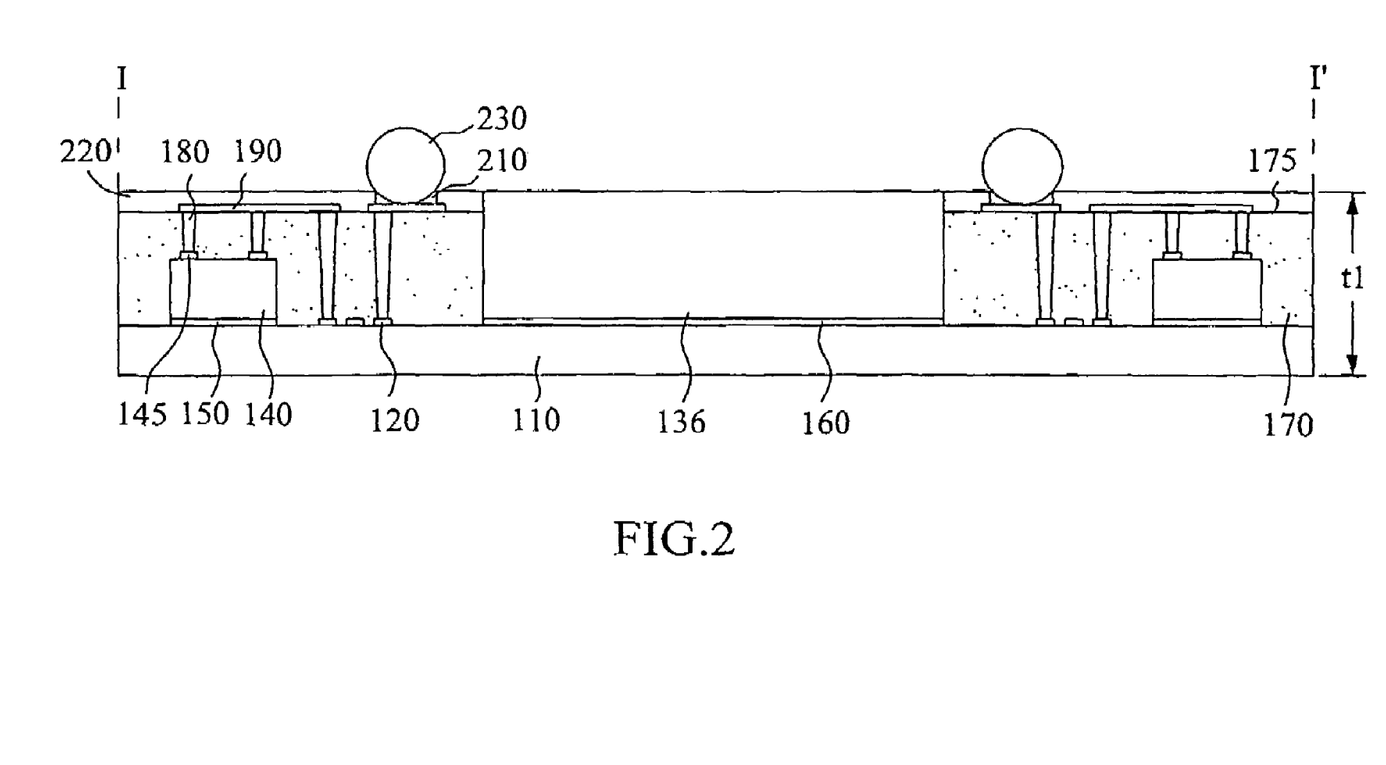
FIG. 2 is a cross-sectional view of a packaging structure of an image sensor module according to the embodiment 1 of the present invention.

As shown in FIG. 2, this embodiment discloses a packaging structure of an image sensor module having a CMOS chip. A transparent substrate 110 having a first patterned conductive layer 120 formed by sputtering is included. A CMOS chip 136 having a photosensitive active area (not shown) is bonded to the transparent substrate 110 with an anisotropic conductive adhesive 160, which is electrically connected to the first patterned conducive layer 120 of the transparent substrate 110 and the photosensitive active area faces the transparent substrate 110. Furthermore, a passive chip 140 having at least one bond pad 145 is bonded to the transparent substrate 110 with an adhesive 150, wherein the bond pad 145 opposing the transparent substrate 110. An insulating build-up film 170 is coated over the transparent substrate 110 so that all of the chips carried on the transparent substrate 110 are buried in the insulating build-up film 170. A plurality of conductive vias 180 is formed in the insulating build-up film 170 by laser drilling. The ends of these conductive vias 180 are connected with the bond pad 145 or the first patterned conductive layer 120 while the other ends of the conductive vias 180 are exposed on a first surface 175 of the insulating build-up film 170. The insulating build-up film 170 is thinner than the CMOS chip 136 so that a surface of the CMOS chip 136 opposing the photosensitive active areas is not covered by the insulating build-up film 170. A second patterned conductive layer 190 is formed on the upper surface 175 of the insulating build-up film 170. A solder mask layer 220 having a plurality of via-holes 210 covers the second patterned conductive layer 190 to protect the second patterned conductive layer 190. A plurality of solder balls 230 is formed in the via-holes 210 of the solder mask layer 220. As a result, a flip chip BGA image sensor module is completed.

The structure of the image sensor module package in this embodiment is characterized by efficient space utilization, as compared with the structure of the traditional image sensor package. The total thickness t1 of the image sensor module of this embodiment is about 650 μm which is the sum of the thickness of the transparent substrate 110 and the thickness of the CMOS chip 136. Thus, the construction of the image sensor device is down-sized compared with the construction of the traditional image sensor package. In addition, the fabrication of the interconnecting lines of the passive chip 140 and the interconnecting lines of the CMOS chip 136 is integrated in the same processing step to reduce the processing steps required for the package, the interconnecting lines herein including the first patterned conductive layer 120, the conductive vias 180 and the second patterned conductive layer 190. Moreover, because the back face of the CMOS chip 136 is fully exposed, the heat dissipation function and operation efficiency are enhanced.

EMBODIMENT 2

Packaging Structure of an Image Sensor Module

Figure 3:
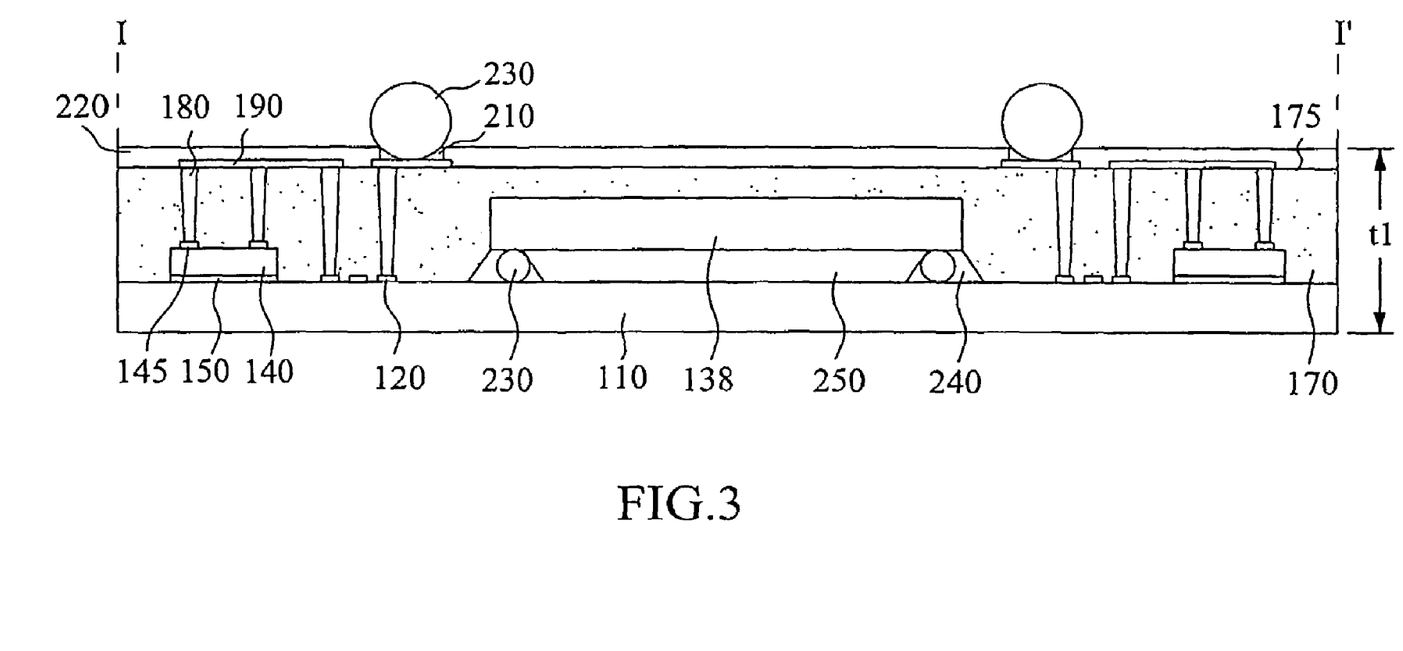
FIG. 3 is a cross-sectional view of a packaging structure of an image sensor module according to the embodiment 2 of the present invention.

As shown in FIG. 3, this embodiment discloses a packaging structure of an image sensor module having a CCD chip. A transparent substrate 110 having a first patterned conductive layer 120 formed by evaporation is included. A CCD chip 138 having a photosensitive active area (not shown) is soldered to the transparent substrate 110 with solder balls 230. The solder balls are electrically connected to the first patterned conducive layer 120 of the transparent substrate 110 and the photosensitive active area faces the transparent substrate 110. An epoxy 240 fills in the space between the solder balls 230 so that the space area 250 between the photosensitive active area (not shown) and the transparent substrate 110 becomes hermetic. Furthermore, a passive chip 140 having at least one bond pad 145 is bonded to the transparent substrate 110 with an adhesive 150, wherein the bond pad 145 opposes the transparent substrate 110. An insulating build-up film 170 is formed over the transparent substrate 110 by pressing so that all of the chips carried on the transparent substrate 110 are buried in the insulating build-up film 170. A plurality of conductive vias 180 is formed in the insulating build-up film 170 by laser drilling. The ends of these conductive vias 180 are connected with the bond pad 145 or the first patterned conductive layer 120 while the other ends of the conductive vias 180 are exposed on a first surface 175 of the insulating build-up film 170. The insulating build-up film 170 is thicker than the CCD chip 138. A second patterned conductive layer 190 is formed on the upper surface 175 of the insulating build-up film 170. A solder mask layer 220 having a plurality of via-holes 210 covers the second patterned conductive layer 190 to protect the second patterned conductive layer 190. The plurality of solder balls 230 is formed in the via-holes 210 of the solder mask layer 220. As a result, an image sensor module is completed.

The structure of the image sensor module package in this embodiment is characterized by efficient space utilization, as compared with the structure of the traditional image sensor package. The total thickness t1 of the image sensor module of this embodiment is about 1 mm, while the thickness of the traditional image sensor package structure is about 2 mm. Thus, the present construction is down-sized. In addition, the fabrication of the interconnecting lines of the passive chip 140 and the interconnecting lines of the CCD chip 138 is integrated in the same processing step to reduce the processing steps required for the package, the interconnecting lines herein including the first patterned conductive layer 120, the conductive vias 180 and the second patterned conductive layer 190.

EMBODIMENT 3

Packaging Structure of an Image Sensor Module

Figure 4:
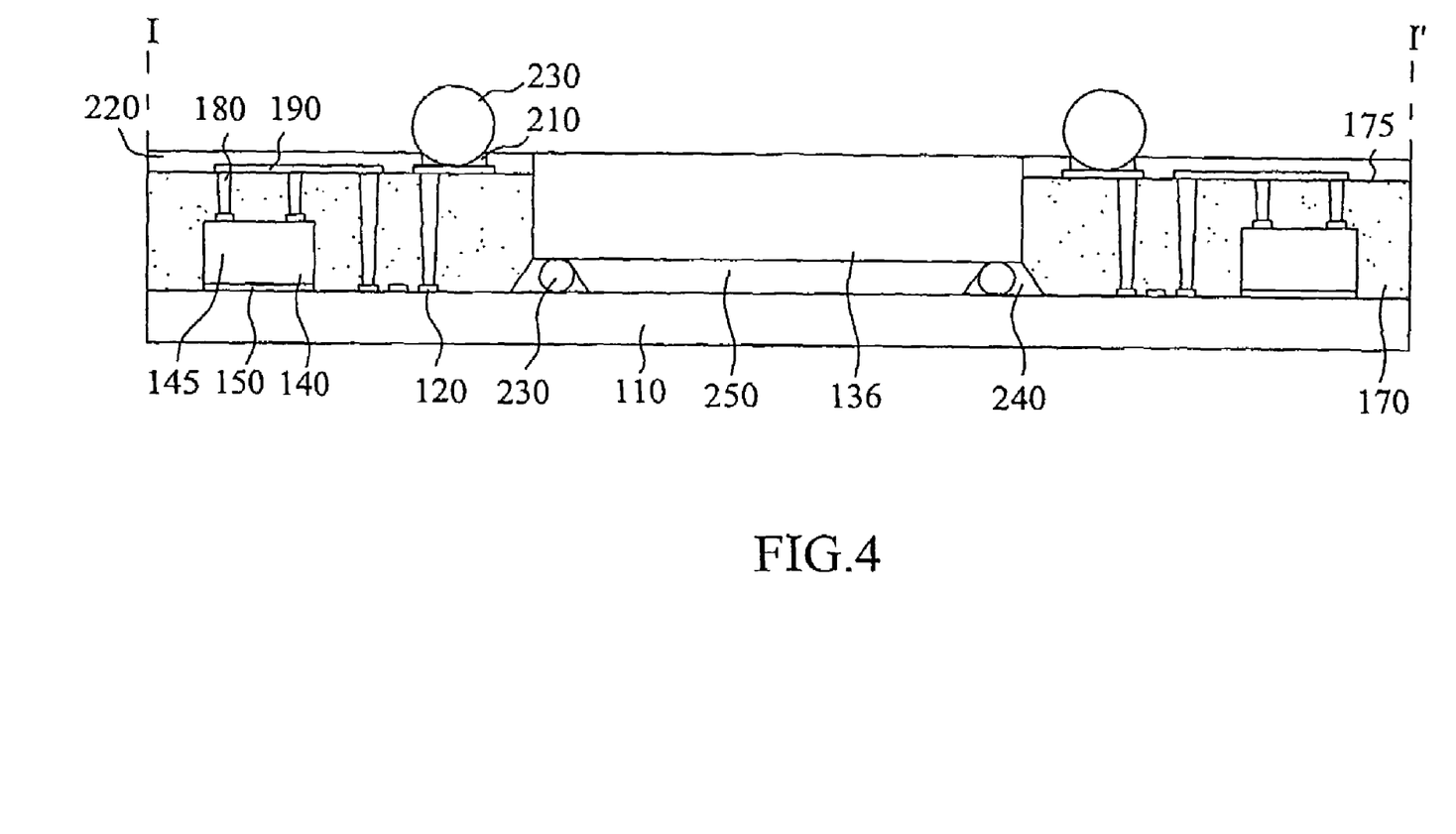
FIG. 4 is a cross-sectional view of a packaging structure of an image sensor module according to the embodiment 3 of the present invention.

As shown in FIG. 4, this embodiment discloses a packaging structure of an image sensor module having a CMOS chip. A transparent substrate 110 having a first patterned conductive layer 120 formed by screen-printing is included. A CMOS chip 136 having a photosensitive active area (not shown) is soldered to the transparent substrate 110 with solder balls 230, wherein the solder balls 230 are electrically connected to the first patterned conducive layer 120 of the transparent substrate 110 and the photosensitive active area faces the transparent substrate 110. An epoxy 240 fills in the space between the solder balls 230 so that the space area 250 between the photosensitive active area (not shown) and the transparent substrate 110 becomes hermetic. Furthermore, a passive chip 140 having at least one bond pad 145 is bonded to the transparent substrate 110 with an adhesive 150, wherein the bond pad 145 opposes the transparent substrate 110. An insulating build-up film 170 is coated over the transparent substrate 110 so that all of the chips carried on the transparent substrate 110 are buried in the insulating build-up film 170. A plurality of conductive vias 180 is formed in the insulating build-up film 170 by laser drilling. The ends of these conductive vias 180 are connected with the bond pad 145 or the first patterned conductive layer 120 while the other ends of the conductive vias 180 are exposed on a first surface 175 of the insulating build-up film 170. The insulating build-up film 170 is thinner than the CMOS chip 136 so that a surface of the CMOS chip 136 opposing the photosensitive active areas (not shown) is not covered by the insulating build-up film 170. A second patterned conductive layer 190 is formed on the upper surface 175 of the insulating build-up film 170. A solder mask layer 220 having a plurality of via-holes 210 covers the second patterned conductive layer 190 to protect the second patterned conductive layer 190. A plurality of solder balls 230 is formed in the via-holes 210 of the solder mask layer 220. As a result, an image sensor module is completed.

The structure of the image sensor module package in this embodiment is characterized by efficient space utilization, as compared with the structure of the traditional image sensor package. Thus, the construction of the image sensor device is down-sized compared with the construction of the traditional image sensor package. In addition, the fabrication of the interconnecting lines of the passive chip 140 and the interconnecting lines of the CMOS chip 136 is integrated in the same processing step to reduce the processing steps required for the package. Moreover, because the back face of the CMOS chip 136 is fully exposed, the heat dissipation function and operation efficiency are enhanced.

Other embodiments of the present invention will be apparent to those skilled in the art from consideration of the specification and practice of the present invention disclosed herein. It is intended that the specification and examples be considered as exemplary only, with a true scope and spirit of the present invention being indicated by the following claims.

What is claimed is:

1. A packaging method of an image sensor module, comprising the steps of:
(A) providing a transparent substrate having a first patterned conductive layer;
(B) carrying an image sensor integrated circuit chip having a photosensitive active area and at least one passive chip having at least one bond pad on said transparent substrate, wherein said photosensitive active area faces said transparent substrate and said bond pad of said passive chip is disposed in a direction opposing said transparent substrate;
(C) forming an insulating build-up film over said transparent substrate; and
(D) forming a plurality of conductive vias on said insulating build-up film, wherein the ends of said conductive vias are connected with said bond pad of said passive chip or said first patterned conductive layer of said transparent substrate, the other ends of said conductive vias are exposed on the surface of said insulating build-up film.

2. The packaging method of an image sensor module of claim 1, further comprising step (E) forming a second patterned conductive layer on said insulating build-up film after step (D).

3. The packaging method of an image sensor module of claim 1, further comprising step (F) forming a solder mask layer having a plurality of via-holes over said second patterned conductive layer to protect said second patterned conductive layer after step (E).

4. The packaging method of an image sensor module of claim 1, further comprising step (G) forming a plurality of solder balls in said via-holes of said solder mask layer which is electrically connected to said conductive vias after step (F).

5. The packaging method of an image sensor module of claim 1, wherein the thickness of said insulating build-up film is less than the thickness of said image sensor integrated circuit chip in step (D).

6. The packaging method of an image sensor module of claim 1, wherein said insulating build-up film is formed by pressing or coating in step (C).

7. The packaging method of an image sensor module of claim 1, wherein said conductive vias are formed by laser drilling in step (D).

8. The packaging method of an image sensor module of claim 1, wherein said image sensor integrated circuit chip is bonded to said transparent substrate with an anisotropic conductive adhesive or a nonconductive adhesive in step (B).

9. The packaging method of an image sensor module of claim 1, wherein said image sensor integrated circuit chip is bonded to said transparent substrate with a solder ball or a solder bump in step (B).

10. The packaging method of an image sensor module of claim 1, wherein said first patterned conductive layer is formed by sputtering, evaporation, screen-printing or film-bonding in step (A).

11. The packaging method of an image sensor module of claim 1, further comprising carrying at least one active chip having at least one bond pad on said transparent substrate, wherein said bond pad of said active chip is disposed in a direction opposing said transparent substrate in step (B).

12. The packaging method of an image sensor module of claim 1, wherein said passive chip is bonded with an adhesive in step (B).

* * * * *